(12) United States Patent
Dziuba

(10) Patent No.: US 11,470,750 B2
(45) Date of Patent: Oct. 11, 2022

(54) ELECTRICAL OR ELECTRONIC DEVICE COMPRISING A HOUSING WITH TWO REGIONS SHIELDED ELECTROMAGNETICALLY FROM EACH OTHER

(71) Applicant: SMA Solar Technology AG, Niestetal (DE)

(72) Inventor: Martin Dziuba, Fuldatal (DE)

(73) Assignee: SMA Solar Technology AG, Niestetal (DE)

( * ) Notice: Subject to any disclaimer, the term of this patent is extended or adjusted under 35 U.S.C. 154(b) by 0 days.

(21) Appl. No.: 16/951,064

(22) Filed: Nov. 18, 2020

(65) Prior Publication Data

US 2021/0076543 A1 Mar. 11, 2021

Related U.S. Application Data

(63) Continuation of application No. PCT/EP2019/064615, filed on Jun. 5, 2019.

(30) Foreign Application Priority Data

Jun. 6, 2018 (DE) ..................... 10 2018 113 409.6

(51) Int. Cl.
*H05K 9/00* (2006.01)
*H05K 5/00* (2006.01)
(Continued)

(52) U.S. Cl.
CPC ......... *H05K 9/0037* (2013.01); *H05K 5/0065* (2013.01); *H05K 7/1432* (2013.01); *H05K 7/209* (2013.01); *H05K 9/0026* (2013.01)

(58) Field of Classification Search
None
See application file for complete search history.

(56) References Cited

U.S. PATENT DOCUMENTS 4,884,171 A 11/1989 Maserang
5,729,441 A 5/1998 Murakami
(Continued)

FOREIGN PATENT DOCUMENTS

CN 201888066 U 6/2011
CN 202310455 U 7/2012

OTHER PUBLICATIONS

International Search Report dated Sep. 12, 2019 in connection with PCT/EP2019/064615.

*Primary Examiner* — James Wu
*Assistant Examiner* — Christopher L Augustin
(74) *Attorney, Agent, or Firm* — Eschweiler & Potashnik, LLC

(57) ABSTRACT

An electrical or electronic device with a housing which includes a rear wall and a side wall peripherally surrounding the rear wall, contains a first region and a second region. The first region includes a shielding from the second region with respect to electromagnetic compatibility (EMC). The housing includes a stepped projection on an inner side of the side wall and/or of the rear wall. The shielding for electromagnetic compatibility includes a shielding plate, by means of which the first region is delimited from the second region. An electrical connection of the shielding plate to the side wall and/or to the rear wall is formed in that a peripheral region that delimits the shielding plate areally overlaps the stepped projection, at least along most of its length, and is fastened on it.

13 Claims, 7 Drawing Sheets

(51) Int. Cl.
*H05K 7/14* (2006.01)
*H05K 7/20* (2006.01)

(56) References Cited

U.S. PATENT DOCUMENTS

| | | | |
|---|---|---|---|
| 6,058,024 A | 5/2000 | Lyford | |
| 6,275,683 B1 | 8/2001 | Smith | |
| 10,206,316 B1* | 2/2019 | Koch | H05K 5/04 |
| 2008/0291632 A1 | 11/2008 | Bremicker | |
| 2009/0161324 A1 | 6/2009 | Sakamoto | |
| 2011/0063810 A1 | 3/2011 | Chen | |
| 2013/0322021 A1* | 12/2013 | Ohoka | H05K 5/0239 |
| | | | 361/679.01 |
| 2013/0335941 A1* | 12/2013 | Minaguchi | H01Q 1/243 |
| | | | 361/818 |
| 2015/0201533 A1* | 7/2015 | Daughtry, Jr. | H05K 9/0028 |
| | | | 29/840 |

* cited by examiner

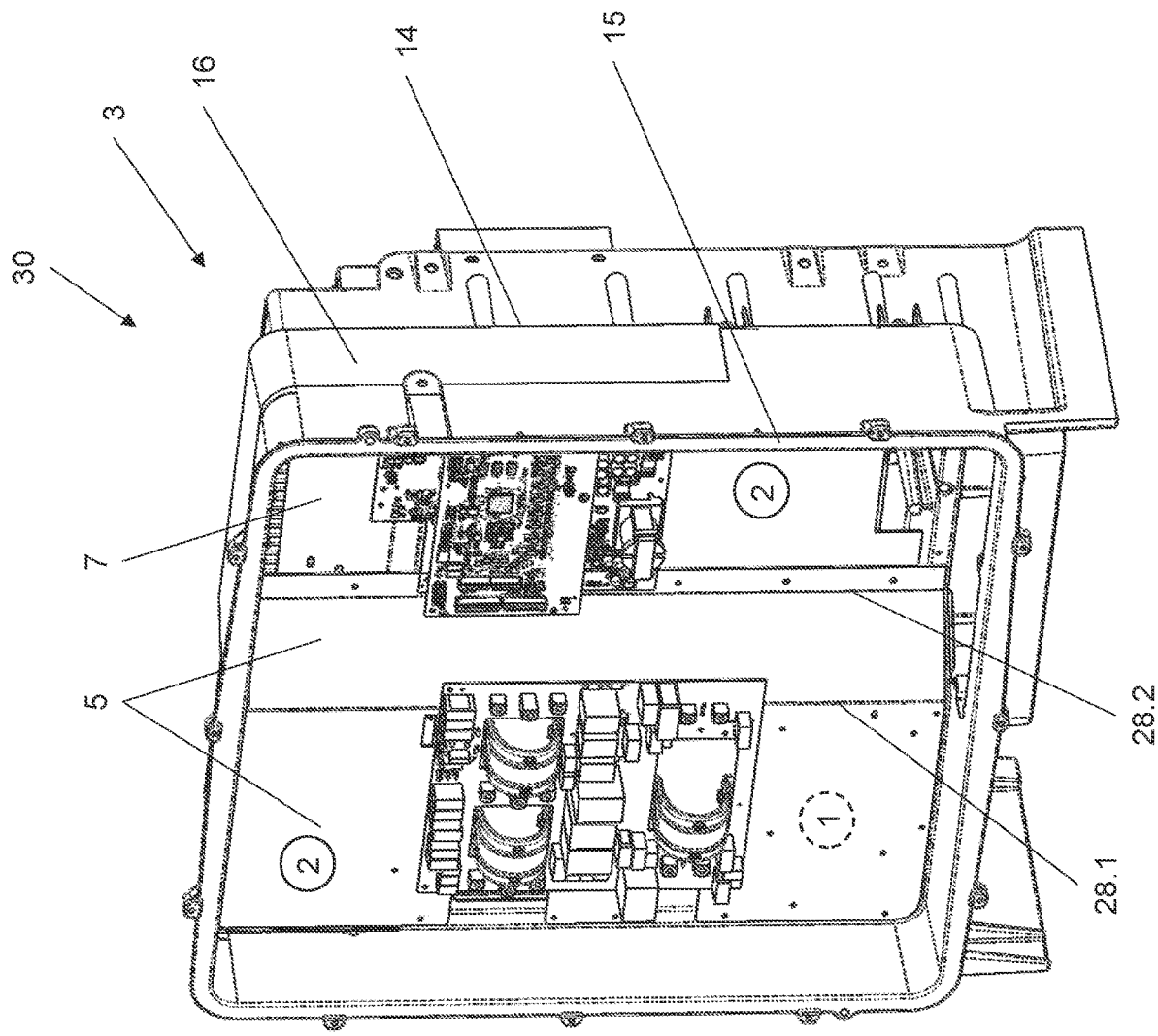

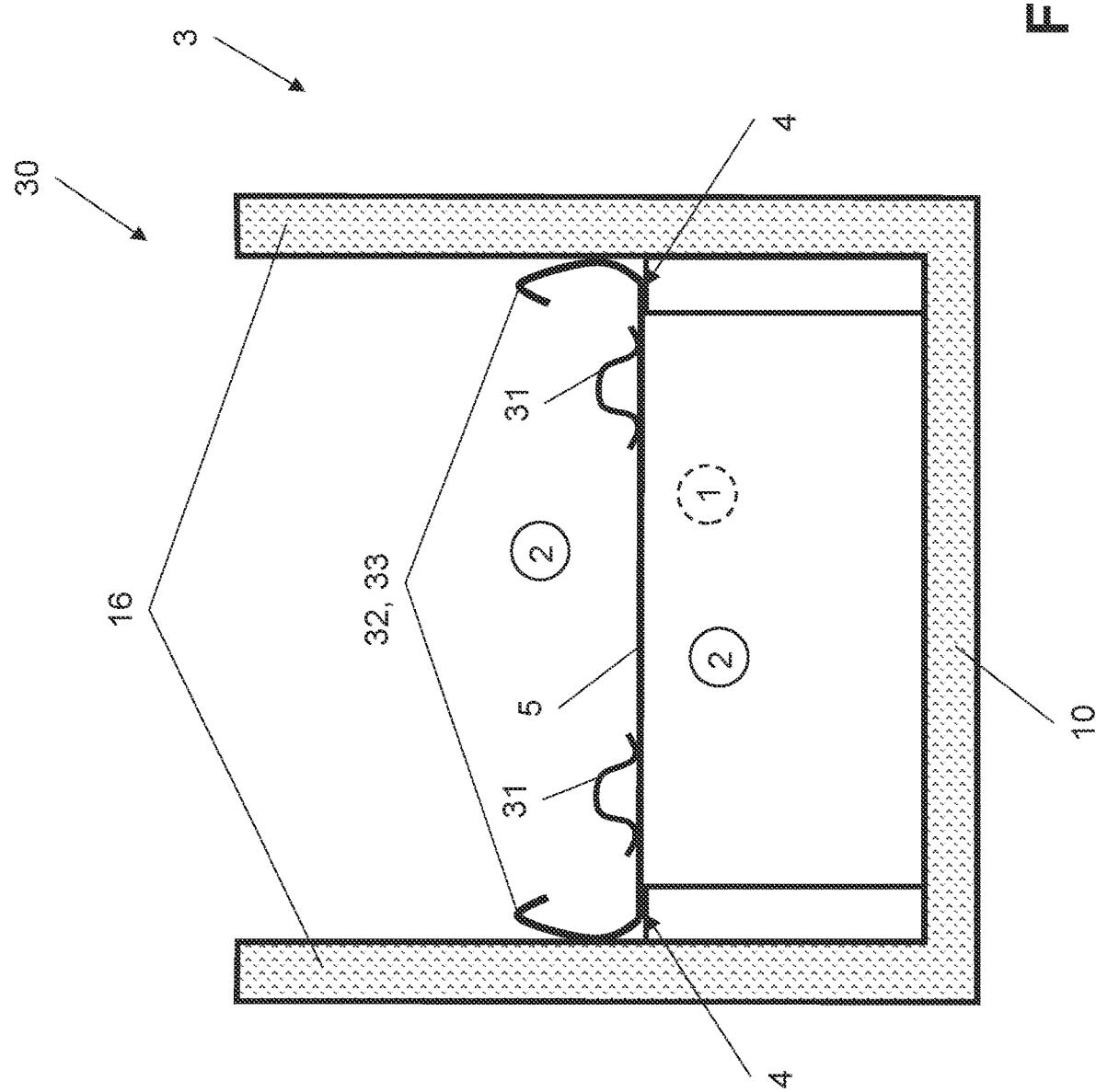

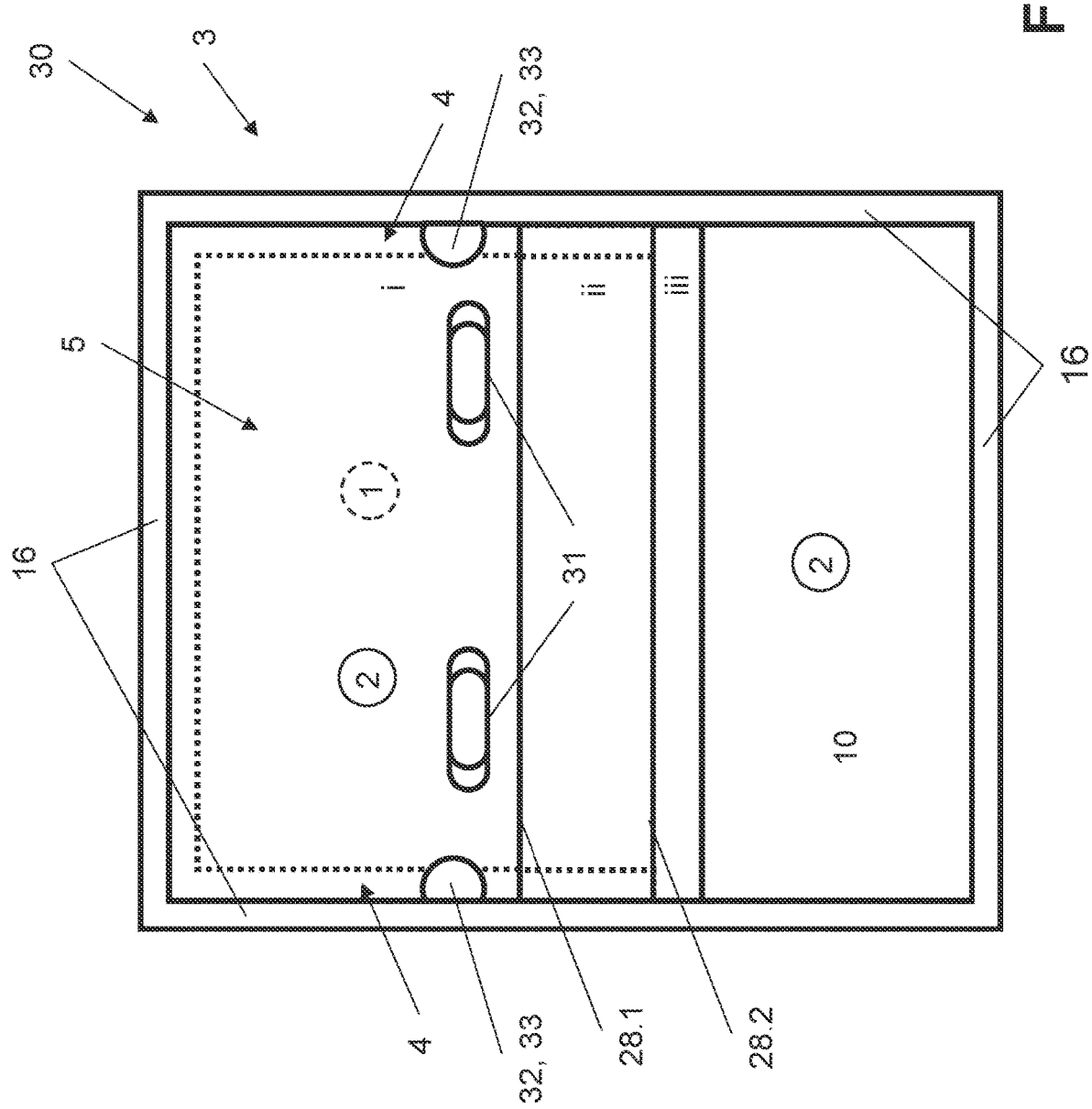

ELECTRICAL OR ELECTRONIC DEVICE COMPRISING A HOUSING WITH TWO REGIONS SHIELDED ELECTROMAGNETICALLY FROM EACH OTHER

CROSS REFERENCE TO RELATED APPLICATIONS

This application is a continuation of International Patent Application number PCT/EP2019/064615, filed on Jun. 5, 2019, which claims priority to German Patent Application number 10 2018 113 409.6, filed on Jun. 6, 2018, and is hereby incorporated by reference in its entirety

FIELD

The disclosure relates to an electrical or electronic device with a housing, which comprises two regions shielded electromagnetically from each other.

BACKGROUND

In the case of conventional electrical or electronic devices with two regions shielded electromagnetically from each other, it is known to provide the shielding by means of a metal shielding plate arranged in a metal housing, for example in a diecast housing. The shielding plate separates in the interior of the housing a first region arranged on one side of the shielding plate from a second region arranged on an opposite side of the shielding plate. For this purpose, the shielding plate is mounted on protruding mountings attached to a rear wall or a side wall of the housing. The protruding mountings, made of metal, have the effect of fixing the shielding plate in the housing and at the same time connecting it electrically to the housing. However, the shielding effect of a shielding plate fastened in the housing in this way is not always adequate—at least if consideration is given to keeping production within a reasonable expenditure. One of the reasons for this is a comparatively great distance between adjacent protruding mountings on which the shielding plate is mounted. The relatively great distance becomes more transmissive to the high-frequency interfering signal to be shielded as the frequency increases, i.e. as the wavelength decreases. Another reason is that the locally confined electrical contact between the shielding plate and the protruding mountings—and consequently the housing—is not formed with sufficiently low impedance. On the other hand, increasing the number of protruding mountings involves excessively increased expenditure in the production of the electrical device, both specifically in terms of the material and specifically in terms of the process. In the case of conventional housings, to avoid the effort of attaching the protruding mountings onto the side wall or the rear wall, it is also known to mold individual protruding mountings onto the side wall or the rear wall of the housing during the diecasting process. This however often results in increased complexity, and as a consequence makes the diecasting mold difficult to create.

The document U.S. Pat. No. 6,275,683 B1 discloses electromagnetic shielding for a radiotelephone comprising a frame with a rectangular wall structure and a shielding insert that fits into the frame and is held in the frame by friction, an interference fit, or snap features.

The document U.S. Pat. No. 4,884,171 discloses a shielding device with an aluminum outer housing. The outer housing has an open top, which is closed by a conductive deck. For the connections between conductive elements, closely spaced screws, high conductivity finishes and EMI gaskets are used.

The document US 2011 0063810 A1 discloses a low-noise converter with a housing having a cavity, a first printed circuit board and a second printed circuit board. A metal layer is arranged on a surface of the first printed circuit board. The second printed circuit board, having a chip, is arranged in the cavity. For shielding an electromagnetic field radiated from the chip, the first printed circuit board is positioned on a supporting surface surrounding the cavity with the metal layer facing the cavity.

The document EP 1996004 A1 discloses a housing for an inverter with at least one recess arranged in a base of the housing for receiving coiled wire products, the recess being coverable by a bulkhead sheet.

SUMMARY

The disclosure addresses the problem of providing an electrical or electronic device with a first region and a second region. The first region comprises a shielding for electromagnetic compatibility (EMC) in relation to the second region. In this case, the shielding can be provided particularly easily and inexpensively. It is also intended to achieve the highest possible packing density of components of the device, with at the same time a high degree of freedom in the arrangement and size of the regions to be shielded.

An electrical or electronic device according to the disclosure comprises a housing, which comprises a rear wall and a side wall peripherally surrounding the rear wall. The housing contains a first region and a second region, the first region comprising a shielding from the second region with respect to electromagnetic compatibility (EMC). In this case, the housing of the device comprises a stepped projection on an inner side of the side wall and/or of the rear wall. Furthermore, the shielding for electromagnetic compatibility comprises a shielding plate, by means of which the first region is delimited from the second region. An electrical connection of the shielding plate to the side wall and/or to the rear wall is formed in that a peripheral region that delimits the shielding plate areally overlaps the stepped projection, at least along most of its length, and is fastened on it. The device is characterized in that the rear wall of the housing forms both a base area of the first region and a base area of the second region, at least part of the shielding plate lying flat on the rear wall and thereby electrically contacting the rear wall directly, or in that a metal plate running above the rear wall in the housing forms both a base area of the first region and a base area of the second region, at least part of the shielding plate lying flat on the metal plate and thereby electrically contacting the metal plate directly.

In the case of the electrical device according to the disclosure, it is possible that an equal number of regions are arranged along any desired connecting line between the cover and the rear wall. This may be in each case just one region or in each case a number of regions. As an alternative to this, it is however also possible that a first number of regions are arranged along a first connecting line between the cover and the rear wall, in particular just one region, and by contrast a second number of regions, different from the first number, in particular two regions, are arranged along a second connecting line between the cover and the rear wall. In both cases, part of the shielding plate may lie flat on the rear wall or on the metal plate running above the rear wall. The part lying on the rear wall or on the metal plate is advantageously a bent-away peripheral region of the shielding plate. The lying flat of the shielding plate has the effect of producing a direct and uninterrupted electrical contact between the shielding plate and the rear wall or between the shielding plate and the metal plate along most of the peripheral region.

Both the rear wall and the side wall mostly comprise a metal, for example aluminum. The rear wall and the side wall are advantageously produced completely from metal. The rear wall and the side wall may each take the form of one part or else a number of interconnected segments. The rear wall and the side wall may be connected to each another releasably or unreleasably. In the latter case, the housing may take the form of a housing which has been produced for example by a deep-drawing or diecasting process. The shielding plate is mostly, advantageously completely, formed from metal. The shielding plate may also take the form of one part or else a number of interconnected segments. The same likewise applies to the metal plate. The stepped projection comprises a supporting surface that is of a planar form, at least in certain regions. The fact that the peripheral region that delimits the shielding plate areally overlaps the stepped projection, in particular its supporting surface, along most of its length, and is fastened on it, means that an electrical contact of a flat form is formed there by way of surface pressing between the shielding plate and the side wall, the metal plate and/or the rear wall. Consequently, the shielding plate is electrically connected along most of its peripheral region transmissively, directly and immediately to the side wall, the rear wall and/or the metal plate. The flat-formed electrical contact has the effect that portions of the peripheral region of the shielding plate that are not connected to the side wall, the rear wall and/or the metal plate are reduced to a minimum, advantageously even avoided entirely. This results in outstanding electromagnetic shielding of the first region arranged on one side of the shielding plate in relation to the second region arranged on the opposite side of the shielding plate. The shielding of the regions in relation to one another is much better than that of the conventional variant, in which an electrical connection of the shielding plate with respect to the side wall and/or with respect to the rear wall is only brought about at isolated points by way of metal protruding mountings. At the same time, the stepped projection can be easily brought about on the side wall, if applicable also on the rear wall of the housing. Specifically, the projection may be formed onto the side wall of the housing for example in a multistage deep-drawing process. If the housing, or parts of the housing, is/are produced by way of a diecasting process, the stepped projection can be provided in a diecasting mold of the housing or on the housing parts. The stepped projection is consequently an integral part of the side wall or of the housing. There is no need for attachment of individual protruding mountings onto the rear wall and/or the side wall of the housing that is necessary in the case of conventional housings. In the case of the device according to the disclosure, the molding of the stepped projection on the side wall and/or the rear wall of the diecasting mold can be implemented much more easily. The stepped projection can also run along the side wall or along the housing at different heights. For example, it may comprise a sloping component extending from a first height up to a second height of the housing. In this way, a great degree of freedom is obtained in a design and arrangement of the first and second regions in relation to one another. As a result of the great degree of freedom, a high packing density of components and—as a consequence—an extremely compact structural form of the electrical or electronic device can be achieved. To sum up, a device comprising two regions with significantly improved electromagnetic shielding of the first region in relation to the second region is obtained. The electrical or electronic device can also be produced inexpensively and in an easy way.

In an embodiment of the electrical or electronic device, the shielding plate comprises a clearance for leading through a cable or a busbar. By means of the cable or the busbar, a component arranged in the first region can be electrically connected to a further component arranged in the second region. The clearance may be arranged on a peripheral region of the shielding plate. Alternatively or additionally, the clearance may also be formed as an opening in an inner region of the shielding plate, in other words away from the peripheral region of the shielding plate. The shielding plate may also comprise an opening at which a connector part of a plug-in connection is attached. The connector part may be a connector part of a male or female configuration. A mating connector of a complementary form may be connected to the connector part and may be used in turn for electrically connecting a component arranged in the first region to a further component arranged in the second region. A slight local weakening of the electromagnetic shielding that the clearance or the opening entails can in this case be tolerated. With sufficiently small dimensions of the clearance or the opening, it is negligible.

In one embodiment of the electrical or electronic device, the housing comprises a releasable cover, which is arranged opposite the rear wall of the housing and is fastened on a periphery of the side wall. In a variant of the embodiment, the first region may be arranged between the rear wall and the shielding plate, while the second region may be arranged on the opposite side of the shielding plate between the shielding plate and the cover. The first region and/or the second region are consequently arranged at least partially one above the other, if applicable also completely one above the other, between the rear wall and the cover.

In an embodiment of the electrical or electronic device in which the stepped projection is arranged on the inner side of the side wall, it surrounds an inner circumference of the housing not only partially, but completely. In this case, the peripheral region that delimits the shielding plate can overlap the stepped projection without any gap, or with at least one clearance as a locally confined gap. In this embodiment, only the first region is adjacent to the rear wall of the housing.

In a further embodiment, the stepped projection comprises a plurality of stiffenings. The stiffenings may be formed as local conical or cylindrical thickenings of the side wall. Beginning on the supporting surface of the step-like projection, they may extend along the side wall in a direction perpendicular to the rear wall, either in the direction of the rear wall or away from it. Such a stiffening of the side wall is advantageous in particular whenever the housing of the electrical or electronic device is formed as a diecast housing, in particular as an aluminum diecast housing. The stiffenings can easily be incorporated in a diecast mold of the diecast housing. They serve the purpose of absorbing the force when the diecast housing is released from the diecasting mold after carrying out the diecasting process.

In one embodiment, the stepped projection is arranged with respect to a height extent of the side wall, i.e. an extent of the side wall that is oriented perpendicularly to the rear wall of the housing, at least mostly in a midway region of the height of the side wall. In this case, the midway region of the height is a region between 20% and 80% of a respective height of the side wall. In this way, sufficient space for arranging electrical or electronic components is available in the device both above and below the stepped projection in the direction of the height extent. The stepped projection may take the form of a different thickness of the side wall. For example, a part above the stepped projection may comprise a small thickness of the side wall, while a region below the stepped projection comprises a thickness of the side wall that is increased by the stepped projection. In an advantageous embodiment, the housing of the electrical or electronic device is constructed in a stepped manner both on the inside and on the outside along a housing dimension oriented perpendicularly to the rear wall, so that the inner projection comprises a corresponding outer projection, which runs at least partially, if applicable completely, along the side wall of the housing. It is also possible that the housing comprises a number of stepped projections arranged one above the other on the side wall. In this way, a thickness of the side wall can be kept to a minimum value necessary for the stability of the housing over most of the side wall. This allows a clear reduction in the necessary housing material, and consequently a significant weight saving.

It is possible in principle that the shielding plate of the electrical or electronic device is connected unreleasably to the stepped projection. In an advantageous variant, on the other hand, the shielding plate is releasably fastened on the stepped projection, for example it is screwed there to the stepped projection. This allows easily implementable subsequent maintenance of the device, in particular with regard to components arranged in the respective regions. The shielding plate advantageously comprises for this purpose a removal device, by means of which easy removal of the shielding plate from the housing can take place. In this case, the removal device is suitable for gripping the shielding plate manually or with an auxiliary tool. The removal device may for example comprise a clearance, a peripheral region bent around as a lug or an eye fastened on the shielding plate.

Because of the structural design, it may be that there are regions of the side wall that are free from a stepped projection along a height of the side wall, even though the shielding plate is also guided along these regions. Without further precautions, a gap would consequently be produced between the inner side of the side wall and the peripheral region of the shielding plate adjacent there. Depending on the extent of the gap, it may lead to adverse impairment of electromagnetic shielding of the regions in relation to one another. In an advantageous variant of the electrical or electronic device, at least the peripheral region of the shielding plate comprises at a region not areally overlapping with the stepped projection a bent-away spring contact which provides a resilient electrical contact with a region, adjacent to the peripheral region of the shielding plate, of the side wall or of the rear wall of the housing. In this way, sufficient electromagnetic shielding can still be obtained even in a peripheral region of the shielding plate that is not overlapping with the stepped projection.

In one embodiment of the electrical or electronic device, the rear wall and/or the side wall of the housing comprises at least one clearance which is covered by a heat sink. In this case, the heat sink is arranged on an outer side of the rear wall or of the side wall and is fastened on it. The heat sink is advantageously a heat sink produced by an extrusion process. Such heat sinks can be produced much less expensively than a heat sink produced by a diecasting process. By covering the clearance, part of the surface of the heat sink is adjacent to the interior space of the housing. In this way, power-electronic components that generate waste heat, for example semiconductor switches, can be mounted directly on the heat sink mounted on the outside, and consequently can be cooled effectively and inexpensively.

According to one embodiment, the electrical or electronic device is formed as a switching converter. The switching converter may be a DC converter (DC/DC) or an inverter (DC/AC). In particular, the inverter may be formed as a photovoltaic (PV) inverter. If the device is formed as a switching converter, the first region of the housing advantageously contains power-electronic components of the switching converter that operate on the basis of a high-frequency signal, generate a high-frequency signal or are intended to block transmission of a high-frequency signal to further electrically connected components. Such power-electronic components may for example comprise semiconductor switches, a driving circuit for the semiconductor switches and/or an EMC filter. The second region of the housing advantageously comprises connecting components for connecting the switching converter to a current source on the input side. If the switching converter is formed as an inverter, in particular as a PV inverter, the current source may comprise a DC source, in particular a PV generator. Furthermore, the second region may contain connecting components for connecting the switching converter to a current sink. If the switching converter comprises an inverter, the current sink is formed as an AC current sink and it may in particular comprise an energy supply grid. Alternatively or additionally, separating elements, for example relays, may be arranged in the second region of the switching converter.

BRIEF DESCRIPTION OF THE FIGURES

The disclosure is further explained and described below on the basis of example embodiments that are represented in the figures. Of these, FIG. 1a-1d show different stages in the construction of the electrical or electronic device according to the disclosure. The following explanation is based on the example of a photovoltaic (PV) inverter as an electrical or electronic device, the housing of which comprises two regions shielded electromagnetically from each other. However, the explanation is not limited to a PV inverter, but can be transferred to any electrical devices with two regions that are shielded electromagnetically from each other.

FIG. 1a shows an early stage in the construction of the device according to the disclosure in one embodiment, FIG. 1b shows an advanced stage in relation to FIG. 1a in the construction of the device according to the disclosure, FIG. 1c shows a more advanced stage in relation to FIG. 1b in the construction of the device according to the disclosure, FIG. 1d shows a more advanced stage in relation to FIG. 1c in the construction of the device according to the disclosure, FIG. 2a shows a cross section through an electrical device according to the disclosure in a further embodiment, FIG. 2b shows a plan view of the electrical device according to the disclosure from FIG. 2a.

DETAILED DESCRIPTION

The disclosure relates to an electrical or electronic device with a housing, which comprises two regions shielded electromagnetically from each other. The regions may be respectively formed in the common housing as regions which are closed off from each other and do not allow any exchange of air with each other. Alternatively, it is however also possible that the regions are not formed as closed off, but connected to each other by way of openings, via which an exchange of air can take place between the regions. The electrical or electronic device comprises components, for example semiconductor switches, which are operated in the device at high frequency and cause interfering electromagnetic radiation. The interfering radiation is usually an undesired side effect in the operation of the device, which cannot however be completely avoided and can adversely influence the operation of other components of the device. In addition, the interfering radiation outwardly emitted by the device is subject to limits specified by relevant guidelines/standards. The interfering radiation in the interior of the device, and if applicable also additionally outside into the surrounding area of the device, must therefore be correspondingly shielded.

Figure 1A:
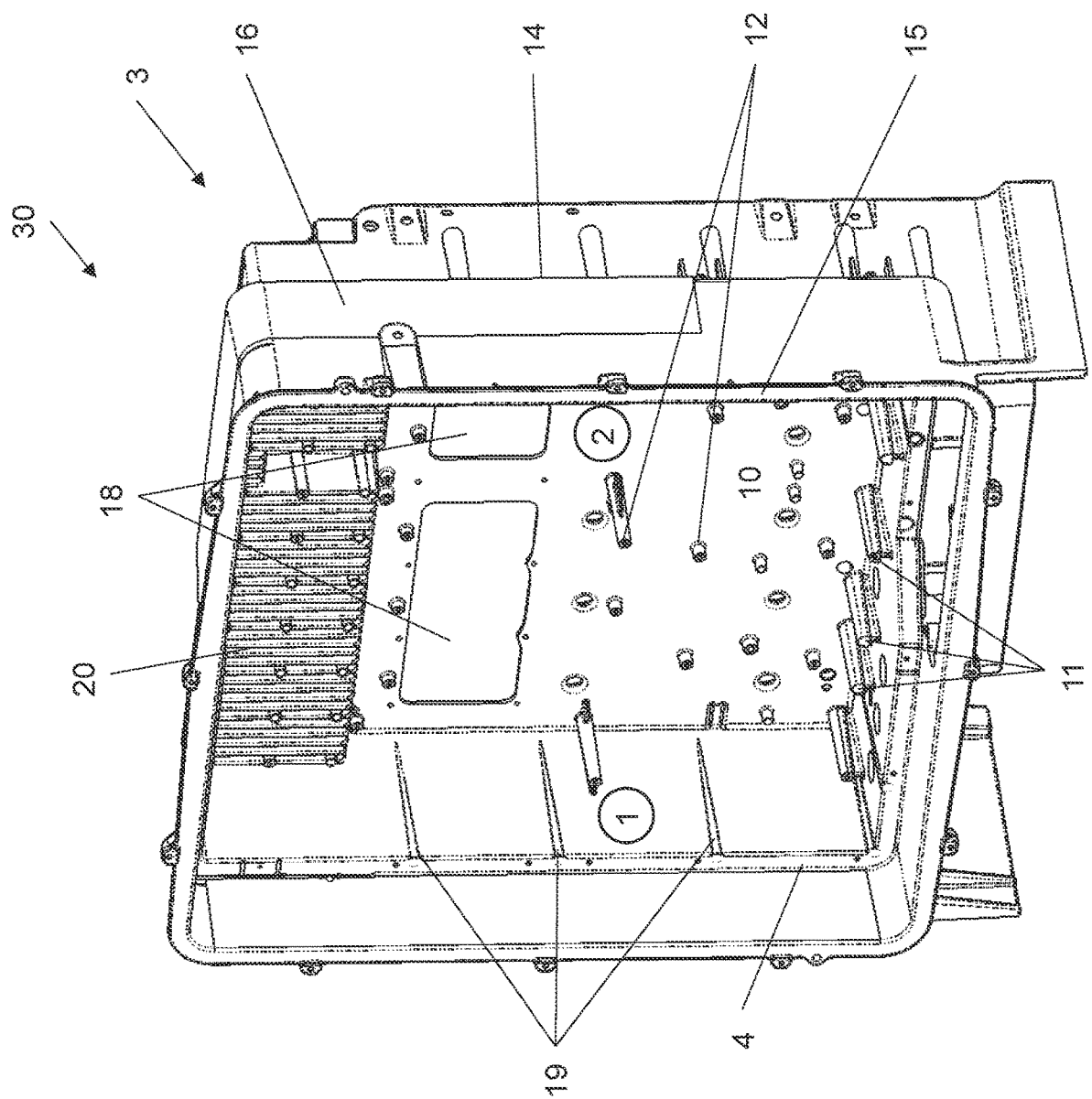

FIG. 1a shows an early stage in the construction of the electrical or electronic device 30 according to the disclosure in the example of a PV inverter as the device 30. The device 30 comprises a housing 3 formed as a diecast housing, in particular as an aluminum diecast housing. The housing 3 comprises a rear wall 10 and a side wall 16 peripherally surrounding the rear wall 10 and connected to the rear wall 10. In this case, the housing 3 represented in FIG. 1a is, by way of example, of a cuboidal configuration. Alternatively, however, a housing with a different form of housing, for example a cylindrically constructed housing, is also possible. Arranged on the rear wall 10 are two clearances 18, which are covered by a heat sink 17 (cf. FIG. 1b) mounted on the rear wall from the outside. The heat sink 17 is formed by way of example in the form of a heat sink produced from an extruded profile. Arranged on an inner side of the rear wall 10 is a heat exchanger 20. The heat exchanger 20 comprises cooling ribs which protrude both into the interior space and into the exterior space of the housing 3. It is formed as an integral part of the housing 3, which is produced together with the housing 3 by a diecasting process. In FIG. 1a, the heat exchanger 20 is formed by way of example as an air/air heat exchanger, which gives off thermal energy of an air stream generated in the interior space, via an inner fan (not represented in FIG. 1a) to a further air stream in the outer region of the housing 3. In this case, the further air stream may be driven by an outer fan (not represented in FIG. 1a), or else be generated convectively. Attached to the rear wall 10 on the inside are metal protruding mountings 12 for fixing and electrically connecting a printed circuit board and/or a metal plate 7 (cf. FIG. 1c) to the housing. Further metal protruding mountings 11, which likewise serve for receiving and electrically connecting a printed circuit board and/or a metal plate 7 (cf. FIG. 1c) to the housing 3, are attached to the side wall 16 and electrically connected directly to it. The side wall 16 comprises on the inside a stepped projection 4 extending over the entire circumference of the housing 3. The projection 4 comprises a supporting surface that is of a planar form, at least in certain regions. Arranged on the outside is a projection 14 corresponding to the inner projection 4. The outer projection 14 also runs along the side wall 16 over the entire circumference of the housing 3. In this way, a step- or terrace-shaped construction of the housing 3 is produced in a direction perpendicular to the rear wall 10. The side wall 16 comprises at some points conical stiffenings 19, which extend between the projection 4 and the rear wall 10. Running along the side wall 16 is a periphery 15 with adjoining threaded bushes, on which a cover 27 (cf. FIG. 1e) can be fastened. The housing 3 also comprises a first region 1 and a second region 2. In this stage of construction, however, the two regions 1, 2 are not yet electromagnetically shielded from each other. The arrangement of the regions 1, 2 and delimitation from one another also cannot be seen yet in FIG. 1a.

Figure 1B:
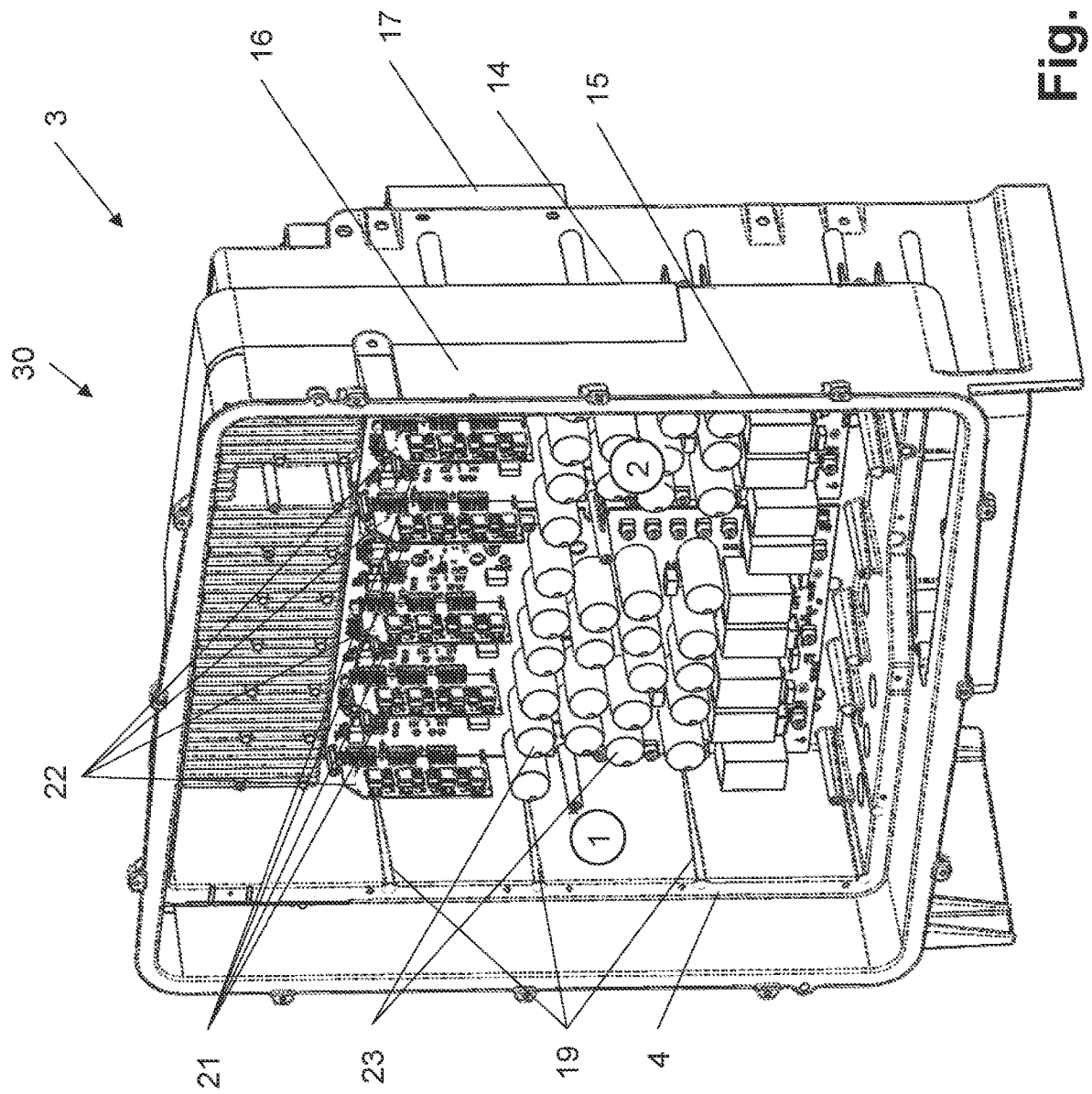

FIG. 1b shows a more advanced stage in relation to FIG. 1a in the construction of the device 30 according to the disclosure from FIG. 1a. Arranged on the inside of the rear side 10 is a first printed circuit board with power-electronic components, which generate high-frequency electrical signals during the operation of the electrical device 30, or are operated by way of high-frequency electrical signals. The interfering radiation generated on account of the high-frequency signals cannot be prevented in the region near the rear wall of the housing 3. It is however intended to be shielded as well as possible from further components in a region arranged further above (here: away from the rear wall) and also from the surrounding area of the electrical device 30. The first printed circuit board comprises a number of driving circuits 22 for a plurality of semiconductor switches 21. For cooling during operation, each of the semiconductor switches 21 is mounted directly on the heat sink 17 fastened on the outside of the housing 3, and is therefore thermally well coupled to it. The first printed circuit board also comprises a multiplicity of capacitors 23 assigned to a DC link circuit of the PV inverter. The first region 1 and the second region 2 are located above the first printed circuit board. Also at this stage, the first region 1 is still not electromagnetically shielded from the second region 2 and still no boundaries of the two regions 1, 2 can be seen.

Figure 1C:
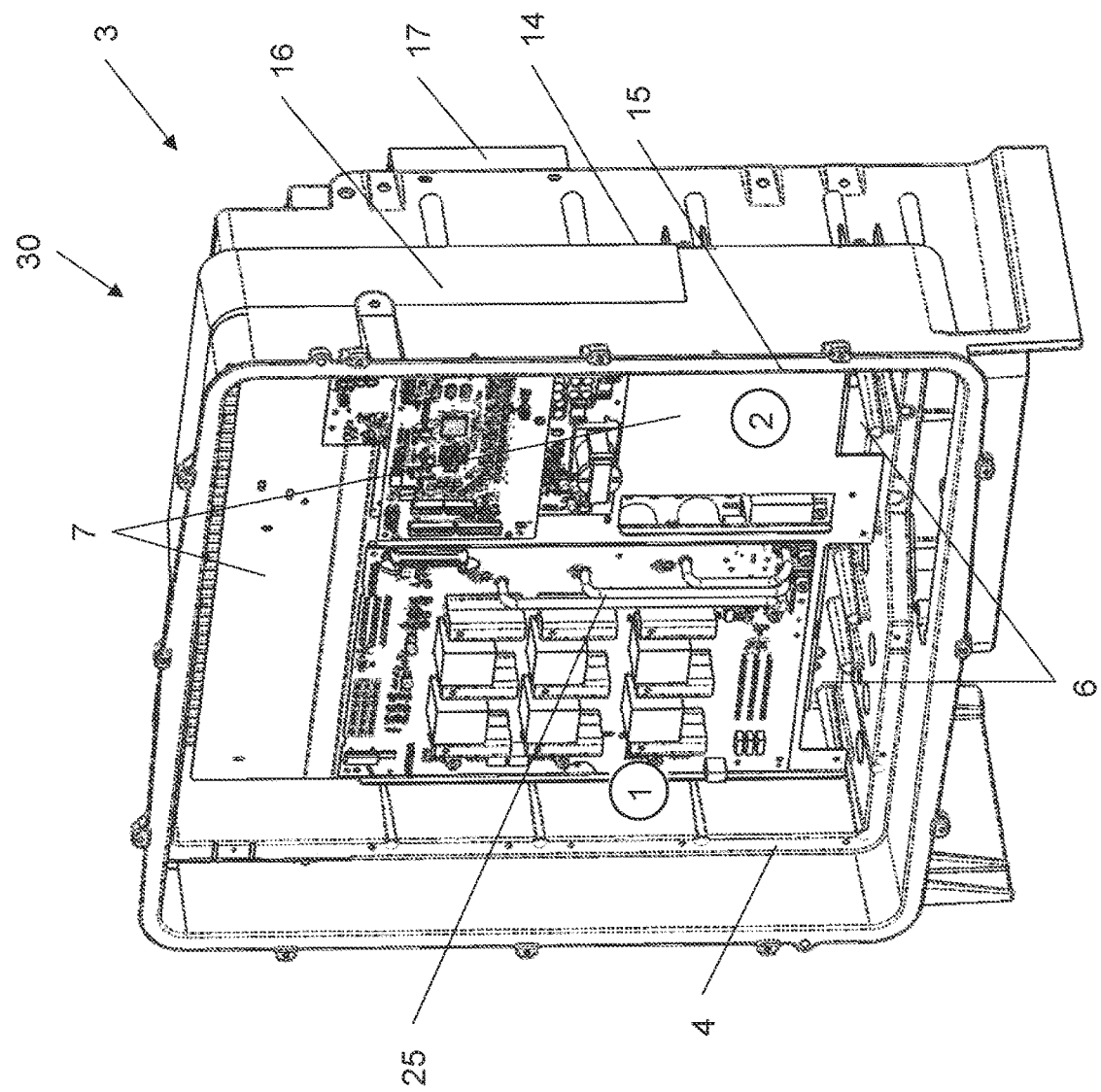

FIG. 1c shows an even more advanced stage in the construction of the device 30 from FIG. 1b. Arranged in a plane that is at a distance from the rear wall but running parallel is a metal plate 7 with printed circuit boards mounted on it. The metal plate 7 is in this case mounted on the protruding mountings 11, 12 and comprises clearances 6 for leading through connecting cables (not represented in FIG. 1c). In FIG. 1c, the metal plate 7 does not lie on the projection 4 in an overlapping manner on account of the clearances 6. As an alternative to this, it is however also possible that the metal plate 7 overlaps the projection 4 running at the same height. The metal plate 7 provides an electromagnetic shielding for the components arranged underneath the metal plate 7 in relation to the electrical components arranged above the metal plate 7. As explained in the following FIGS. 1d and 1e, the metal plate 7 forms both a base area of the first region 1 and of the second region 2. In this case, the first region 1 is arranged on one side (here: the left), while the second region is arranged on the other side (here: the right) above the metal plate 7. It is the aim hereafter to shield electromagnetically the electrical components arranged on one side (here: the left) of the metal plate 7 from the components arranged on the other side (here: the right) of the metal plate 7.

FIG. 1d shows an even more advanced stage in the construction of the device 30 according to the disclosure from FIG. 1b. The components on one side of the metal plate 7 are shielded electromagnetically from the components on the other side of the metal plate 7 by way of a shielding plate 5. The first region 1 in FIG. 1d is consequently separated from the second region 2 by the shielding plate 5. In this case, the first region 1 is located between the metal plate 7 and the shielding plate 5, while the second region 2 is arranged between the metal plate 7 and the cover 27, and is also arranged between the shielding plate 5 and the cover 27 (cf. FIG. 1e). The shielding plate 5 is by way of example formed as one part. As an alternative to this, it is however also possible that it is made up of a number of segments, which are screwed together overlapping one another. It is constructed in a planar manner over a large part of its extent, but comprises a region which is bent away over two bending edges 28.1, 28.2 and connects two parallel running partial areas to one another. A peripheral region of the shielding plate 5 overlaps with the stepped projection 4 and is screwed together with it. Only at one point on the peripheral region of the shielding plate 5 are clearances 6 arranged, through which a number of busbars or a number of cables can protrude. (The clearances cannot be seen in FIG. 1*d*, since they are concealed by a further printed circuit board arranged above the shielding plate 5). The busbars and the cables serve for connecting the electrical components arranged in the first region 1 to further components that are arranged in the second region 2 of the housing 3. In FIG. 1*d*, the reference sign relating to the first region 1 is shown with a dashed line, since the first region 1 is arranged underneath the shielding plate 5 and is therefore concealed by the shielding plate 5. The second region 2 is arranged above the shielding plate 5 and the metal plate 7, is visible and is therefore indicated by a solid form of notation.

Figure 1E:
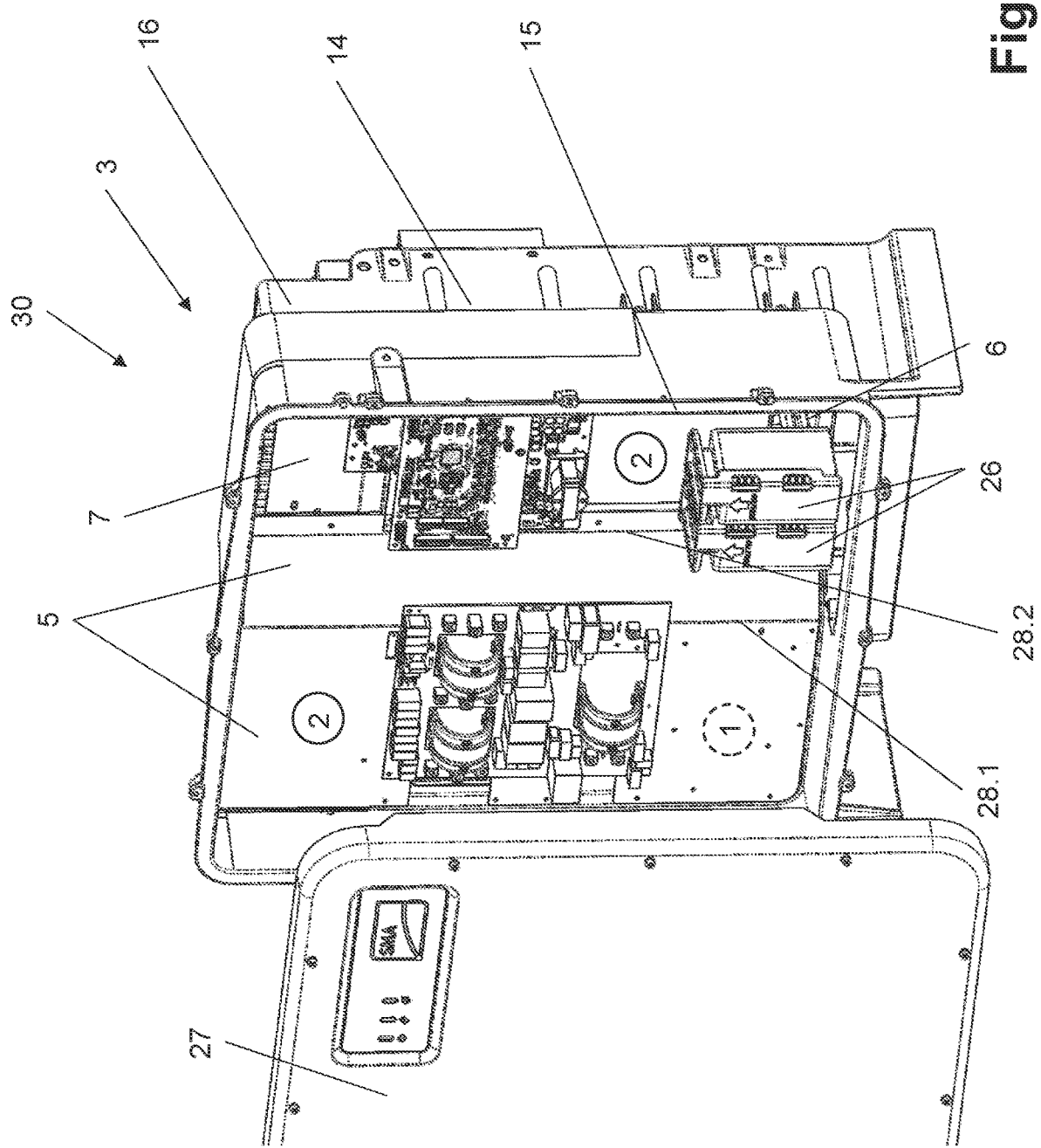
FIG. 1e shows an almost final stage in the construction of the device according to the disclosure according to FIG. 1a-1d.

In FIG. 1*e* an almost final stage in the construction of the electrical or electronic device 30 is represented. In this way, a direct, flat-formed electrical contact running continuously—apart from the clearances 6 of small dimensions—is formed along most of the peripheral region between the shielding plate 5 and the side wall 16. In addition, a peripheral region of the shielding plate 5 comprises a flat-formed electrical contact between the shielding plate 5 and the metal sheet 7. The first region 1 is to a great extent shielded electromagnetically from the second region 2 by the shielding plate 5 electrically connected flat against the inner side of the side wall 16 and flat against the metal plate 7.

In the second region 2, which is arranged between a cover 27 of the device 30 and the shielding plate 5, there are located among other things connecting components and separating elements of the PV inverter. The connecting components may comprise connecting elements that can be screwed, plugged or clamped. They may comprise additional protective or fixing elements, which fix the connecting elements in relation to one another and prevent them from short-circuiting. The connecting components allow the PV inverter to be connected on the input side to a PV generator as a DC current source. By way of example, the connecting elements on the input side are formed as screwed cable glands (concealed in FIG. 1*e* and therefore not visible). In this case, the screwed cable glands are surrounded by insulators 26 and are fixed in relation to one another by them, thereby preventing contact of the screwed cable glands with one another that would cause a short circuit. The inverter is connected on the output side by way of AC terminals (not represented in FIG. 1*e*) to a power supply grid. The connection to the PV generator, and also to the power supply grid, may comprise further separating elements that are not represented in FIG. 1*e*, for example relays. The second region 2, and the housing 3, is closed off by the sealing cover 27 on the periphery 15 of the side wall 16. For this purpose, the cover 27 is screwed with the threaded bores arranged on the periphery 15.

In FIG. 2*a*, a cross section through an electrical or electronic device 30 in a second embodiment is represented. In the second embodiment, the first region 1 is arranged within the housing 3 between the rear wall 10 and the shielding plate 5. However, the first region does not extend along the complete rear wall 10, but only along a rear part of it. In a front part of the rear wall 10, the second region 2 is arranged. A peripheral region of the shielding plate 5 overlaps with a stepped projection 4, which is arranged on the inside of the side wall 16 and on which the shielding plate 5 is screwed. The shielding plate 5 runs downward along the projection 4 to the inner side of the rear wall 10, lies there flat on the rear wall 10 and thereby electrically contacts the rear wall 10. In the second embodiment of the device 30, the rear wall 10 forms both a base area of the first region 1 (in a rear region of the plane of the drawing) and a base area of the second region 2 (in a front region of the plane of the drawing). In this case, the second region 2 is located both between the shielding plate 5 and a cover that is not represented in FIG. 2*a* and between the rear wall and the cover that is not represented in FIG. 2*a*. To this extent, the second embodiment of the device resembles the first embodiment represented in FIGS. 1*a*-1*e*. In the case of the first embodiment according to FIGS. 1*a*-1*e*, the metal plate 7 forms both a base area for the first region 1 and a base area for the second region 2. In the case of the second embodiment, on the other hand, the rear wall 10 forms both a base area of the first region 1 and a base area of the second region 2. By contrast with FIGS. 1*a*-1*e*, a representation of the electrical or electronic components has been dispensed with in FIG. 2*a*. Instead, in FIG. 2*a* various variants of a removal device arranged on the shielding plate 5 are illustrated.

On a side of the shielding plate 5 that is facing away from the rear wall 10, two eyes 31 are attached. Each of the eyes 31 may be penetrated either manually or with a tool, whereby the shielding plate 5 can be easily removed upwardly once it has been released from the stepped projection 4. Located on two opposite sides of the shielding plate 5 are a number of peripheral regions—here by way of example two—that are bent away as lugs 33. The shielding plate 5 can be gripped by the lugs 33 and removed from the housing 3. Advantageously, the lugs 33 comprise for this purpose at their ends a region that is once again bent away and further facilitates gripping of the shielding plate 5. In FIG. 2*a*, the lugs 33 are at the same time configured as a spring contact 32, which provides a resilient contact with an inner side of the side wall 16. This is however only optional in the case of the lug 33 configured as a removal device and is not absolutely necessary.

FIG. 2*b* shows the second embodiment of the electrical device 30 from FIG. 2*a* in a plan view from the direction of a cover (not represented in FIG. 2*b*). The shielding plate 5 lying on the projection 4 comprises two bending edges 28.1, 28.2. A first portion i of the shielding plate 5 runs at a distance from and parallel to the rear wall 10. Arranged between the bending edges 28.1 and 28.2 is a second portion ii of the shielding plate 5. In this case, the second portion ii slopes with respect to the rear wall 10 and extends from a height of the housing assigned to the first portion i down to a height of the rear wall 10. A third portion iii of the shielding plate 5 again runs parallel to the rear wall 10 and forms a flat electrical contact with the rear wall 10. The part of the projection 4 extending between the bending edges 28.1 and 28.2 likewise slopes with respect to the rear wall 10 of the device, so that the shielding plate 5 lies flat on the projection 4. The first region 1 is arranged between the shielding plate 5 and the rear wall 10. Underneath the shielding plate 5, it extends over the first portion i and the second portion ii of the shielding plate 5. The second region 2 is arranged in a lower housing portion between the rear wall 10 and the cover, while in an upper housing portion it extends between the shielding plate 5 and the cover.

The invention claimed is:

1. An electrical or electronic device with a housing, the housing comprising:
   a rear wall and a side wall peripherally surrounding the rear wall,
   a first region and a second region, the first region comprising a shielding from the second region with respect to electromagnetic compatibility (EMC),
   a stepped projection on an inner side of the side wall and/or of the rear wall,
   wherein the shielding for electromagnetic compatibility comprises:
      a shielding plate that delimits the first region from the second region, and
      an electrical connection of the shielding plate to the side wall and/or to the rear wall via a peripheral region of the shielding plate that areally overlaps the stepped projection of the housing, at least along most of its length, and is fastened on it,
   wherein the rear wall of the housing forms both a base area of the first region and a base area of the second region, wherein at least part of the shielding plate lies flat on the rear wall and thereby electrically contacts the rear wall directly, or
   wherein a metal plate running above the rear wall in the housing forms both a base area of the first region and a base area of the second region, and at least part of the shielding plate lies flat on the metal plate and thereby electrically contacting the metal plate directly,
   wherein the electrical or electronic device is formed as an inverter, and
   wherein the first region of the housing contains power-electronic components of the inverter, while the second region contains connecting components for connecting the inverter to a DC current source, to an AC current sink, and/or separating elements.

2. The electrical or electronic device as claimed in claim 1, wherein the shielding plate comprises a clearance configured to lead through a cable or a busbar, which electrically connects a component arranged in the first region to a further component arranged in the second region.

3. The electrical or electronic device as claimed in claim 1, wherein the shielding plate comprises an opening.

4. The electrical or electronic device as claimed in claim 1, further comprising a releasable cover arranged opposite the rear wall of the housing and fastened on a periphery of the side wall.

5. The electrical or electronic device as claimed in claim 4, wherein the first region is arranged between the rear wall and the shielding plate, while the second region is arranged between the shielding plate and the releasable cover.

6. The electrical or electronic device as claimed in claim 1, wherein the stepped projection is arranged on the inner side of the side wall and completely surrounds an inner circumference of the housing.

7. The electrical or electronic device as claimed in claim 1, wherein the housing is constructed in a stepped manner both on an inside thereof and on an outside along a housing dimension oriented perpendicularly to the rear wall, so that an inner projection has a corresponding outer projection, which runs at least partially along the side wall of the housing.

8. The electrical or electronic device as claimed in claim 1, wherein the stepped projection comprises a plurality of stiffenings.

9. The electrical or electronic device as claimed in claim 1, wherein the shielding plate is releasably fastened on the stepped projection.

10. The electrical or electronic device as claimed in claim 1, wherein the housing is formed as a diecast housing.

11. The electrical or electronic device as claimed in claim 1, wherein the peripheral region of the shielding plate comprises at a region not areally overlapping with the stepped projection a bent-away spring contact, which provides a resilient electrical contact with a side wall or a rear wall of the housing.

12. The electrical or electronic device as claimed in claim 1, wherein the rear wall or the side wall of the housing comprises a clearance, which is covered by a heat sink arranged on an outer side of the rear wall or of the side wall, respectively, and is fastened on it, respectively.

13. An electrical or electronic device with a housing, the housing comprising:
   a rear wall and a side wall peripherally surrounding the rear wall,
   a first region and a second region, the first region comprising a shielding from the second region with respect to electromagnetic compatibility (EMC),
   a stepped projection on an inner side of the side wall and/or of the rear wall,
   wherein the shielding for electromagnetic compatibility comprises:
      a shielding plate that delimits the first region from the second region, and
      an electrical connection of the shielding plate to the side wall and/or to the rear wall via a peripheral region of the shielding plate that areally overlaps the stepped projection of the housing, at least along most of its length, and is fastened on it,
   wherein the rear wall of the housing forms both a base area of the first region and a base area of the second region, wherein at least part of the shielding plate lies flat on the rear wall and thereby electrically contacts the rear wall directly, or
   wherein a metal plate running above the rear wall in the housing forms both a base area of the first region and a base area of the second region, and at least part of the shielding plate lies flat on the metal plate and thereby electrically contacting the metal plate directly,
   wherein the shielding plate comprises a removal device, by means of which easy removal of the shielding plate from the housing takes place, wherein the removal device comprises a clearance, a peripheral region bent around as a lug or an eye fastened on the shielding plate.

* * * * *